(12) United States Patent
Ito et al.

(10) Patent No.: US 7,875,527 B2
(45) Date of Patent: Jan. 25, 2011

(54) MANUFACTURING METHOD FOR SEMICONDUCTOR DEVICE AND SEMICONDUCTOR DEVICE

(75) Inventors: Yasuhiro Ito, Oita-ken (JP); Kunihiro Miyazaki, Oita-ken (JP); Kenji Takakura, Oita-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 140 days.

(21) Appl. No.: 12/359,635

(22) Filed: Jan. 26, 2009

(65) Prior Publication Data
US 2009/0212387 A1 Aug. 27, 2009

(30) Foreign Application Priority Data
Jan. 28, 2008 (JP) .............................. 2008-016207

(51) Int. Cl.
*H01L 21/76* (2006.01)
(52) U.S. Cl. ................................ 438/424; 257/E21.546
(58) Field of Classification Search ................. 438/424; 257/E21.546
See application file for complete search history.

(56) References Cited

U.S. PATENT DOCUMENTS
5,981,356 A 11/1999 Hsueh et al.
6,750,117 B1 * 6/2004 Hung et al. .................. 438/437
2008/0057672 A1 * 3/2008 Rossi et al. .................. 438/437

FOREIGN PATENT DOCUMENTS
JP 2000-21967 1/2000

* cited by examiner

*Primary Examiner*—Alexander G Ghyka
*Assistant Examiner*—Seahvosh J Nikmanesh
(74) *Attorney, Agent, or Firm*—Finnegan, Henderson, Farabow, Garrett & Dunner, L.L.P.

(57) ABSTRACT

A trench is formed on a semiconductor substrate with a first insulation film patterned on the semiconductor substrate as a mask; a second insulation film is embedded in the trench and flattened; an upper portion of the first insulation film is selectively removed, and a part of a side face of the second insulation film is exposed; a part of the second insulation film is isotropically removed; a lower portion of the remaining first insulation film is selectively removed; and then a part of the remaining second insulation film is further isotropically removed so that an upper face of the second insulation film is at a predetermined height from a surface of the semiconductor substrate, a taper having a minimum taper angle of 90° or more is formed on the side face of the second insulation film, and a STI is formed.

15 Claims, 3 Drawing Sheets

MANUFACTURING METHOD FOR SEMICONDUCTOR DEVICE AND SEMICONDUCTOR DEVICE

CROSS-REFERENCE TO RELATED APPLICATION

This application is based upon and claims the benefit of priority from the prior Japanese Patent Application No. 2008-16207 filed on Jan. 28, 2008, the entire contents of which are incorporated herein by reference.

BACKGROUND OF THE INVENTION

The present invention relates to a manufacturing method for a semiconductor device, for example, using STI (Shallow Trench Isolation) for element isolation.

In recent years, with requirements of miniaturization and high functionality of electronic devices, STI has been used as an element isolation technique for improvement of device performance, such as miniaturization and higher performance.

Generally, STI is formed in the following way. First, a shallow trench is formed on a semiconductor substrate using a mask material such as a SiN film by RIE (Reactive Ion Etching) method. After an insulating material is embedded in the trench using HDP-CVD (High Density Plasma-Chemical Vapor Deposition) method, the trench is flattened using CMP (Chemical Mechanical Polishing) method. In addition, the mask material is selectively removed using hot phosphoric acid ($H_3PO_4$) solution to form STI. At this time, there is a height difference corresponding to the mask material between a formed STI surface and a semiconductor substrate surface.

Next, on the semiconductor substrate including the STI, a gate electrode material such as a polysilicon film and a gate side wall material such as a TEOS (Tetra Ethoxy Silane) film, a BSG film (boron-doped oxide film) and an SiN film are deposited and patterned to form a gate electrode. At this time, such materials remain on a STI side face at the height difference portion, which causes a low yield due to dust generation.

Accordingly, there has been known a method for forming a side face (height difference) of a protruding STI into a forward tapered shape to inhibit generation of etching residues during processing of a gate electrode or a gate side wall, as disclosed in claim 1 and a paragraph [0019] of Japanese Patent Application Laid-Open No. 2000-21967. However, processing of STI after removal of a mask material causes damage to a semiconductor substrate so that gate leak due to a crystalline defect may occur. Further, by only chamfering the side face, residues cannot be effectively removed.

SUMMARY

According to an aspect of the present invention, there is provided a manufacturing method for a semiconductor device including: forming a trench on a semiconductor substrate with a first insulation film patterned on the semiconductor substrate as a mask; embedding a second insulation film in the trench; selectively removing an upper portion of the first insulation film to expose a part of a side face of the second insulation film; isotropically removing a part of the second insulation film; selectively removing a lower portion of the remaining first insulation film; further isotropically removing a part of the remaining second insulation film so that an upper face of the second insulation film is at a predetermined height from a surface of the semiconductor substrate, a taper having a minimum taper angle of 90° or more is formed on the side face of the second insulation film, and a STI is formed.

According to an aspect of the present invention, there is provided a semiconductor device including an active area formed on a semiconductor substrate, and a STI which isolates the active area and has an upper face protruding to a height of 22 to 50 nm from a surface of the semiconductor substrate and a side face having a taper of a minimum taper angle of 90° or more.

DETAILED DESCRIPTION

Figure 1:
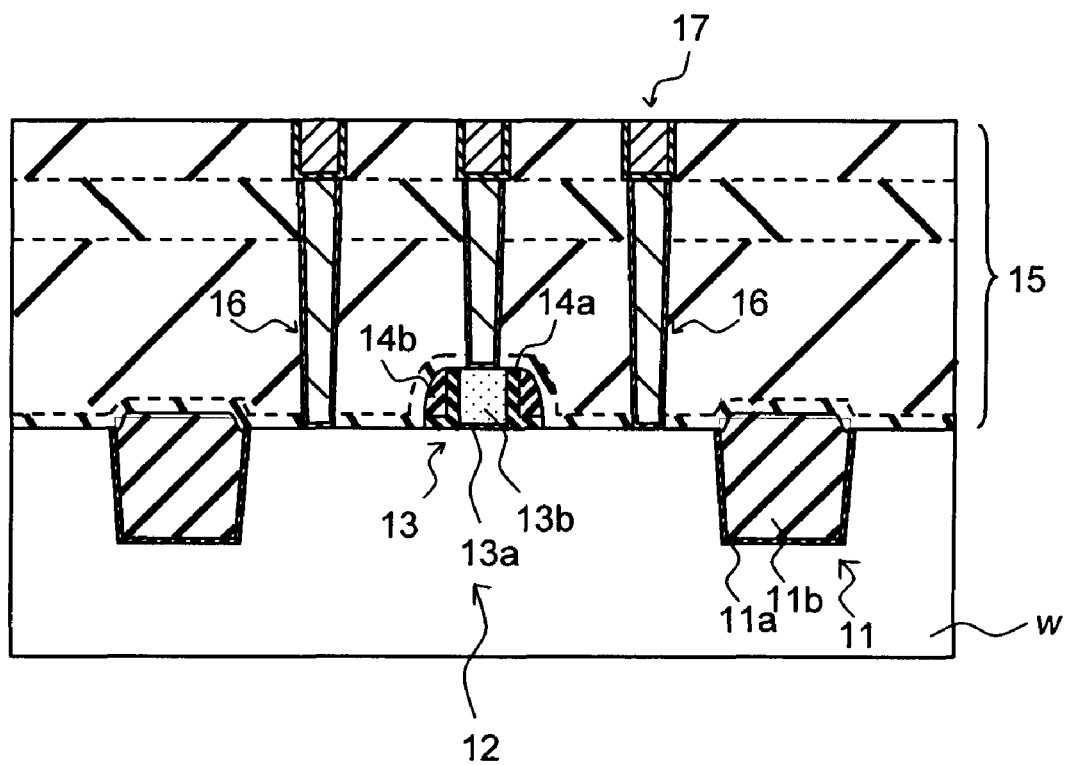
FIG. 1 is a sectional view of MOSFET cell in a semiconductor device according to an aspect of the present invention.

Reference will now be made in detail to the present embodiment of the invention, an example of which is illustrated in the accompanying drawings. Wherever possible, the same reference numbers will be used throughout the drawing to refer to the same or like parts.

FIG. 1 is a sectional view of MOSFET cell formed by a manufacturing method for a semiconductor device according to the present embodiment. As illustrated in FIG. 1, for example, as a semiconductor substrate, a semiconductor substrate w, such as a bulk Si substrate, a SOI (Silicon On Insulator) substrate, is used and the semiconductor substrate w is element-isolated by a STI 11.

Figure 2:
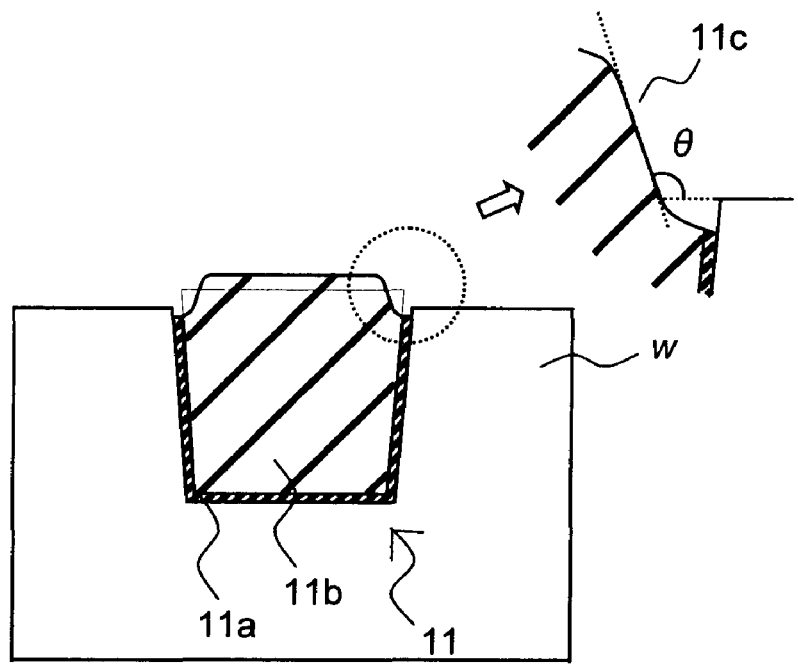
FIG. 2 is a view illustrating a taper angle of a STI side face according to an aspect of the present invention.

The STI 11 is formed from, for example, a thermal oxide film 11a/a TEOS film 11b. A top face of the TEOS film 11b is protruding from a surface of the semiconductor substrate w and, on the side face of a protruding portion of the TEOS film 11b, a taper 11c is formed. As illustrated in FIG. 2, when an angle between a tangential line at an arbitrary point of the side surface of the STI 11 and a surface of the semiconductor substrate w is taken as a taper angle θ in a cross section of the STI 11, the taper 11c is shaped so that the taper angle θ is 90° or more. Specifically, a minimum taper angle is 90° or more. An end portion of the taper 11 in contact with the semiconductor substrate w is depressed from the surface of the semiconductor substrate w.

In a region element-isolated by the STI 11, there is formed an active area 12 having source-drain regions and an LDD (Lightly Doped Drain) regions formed so as to sandwich a channel region in a well. On the active area 12, there is formed a gate electrode 13 including a polysilicon layer 13b formed on a gate insulation film 13a and a silicide layer (not illustrated) formed on the surface of the gate electrode 13. The gate electrode 13 has gate side walls including insulation films such as a TEOS film 14a and a SiN film 14b.

On these layers, an interlayer film 15 is formed and the source-drain regions and the gate electrode 13 are connected, through contacts 16 formed so as to penetrate through the interlayer film 15, to an upper-layer wiring 17 and an electrode (not illustrated) to configure MOSFET.

Figure 3A:
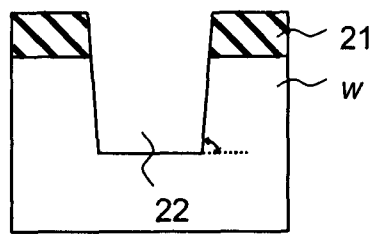
FIGS. 3A to 3E are views illustrating a manufacturing process of a MOSFET cell according to an aspect of the present invention.

Such a semiconductor device is formed in the following way. First, as illustrated on a partial sectional view of a STI formation region in FIG. 3A, a SiN film 21 is formed in thickness of, for example, 150 nm on the semiconductor substrate w using LPCVD (Low Pressure Chemical vapor Deposition) method. A resist film is applied onto the SiN film 21 and a resist pattern is formed using the lithographic technique.

With the resist pattern as a mask, the SiN film 21 is etched using the RIE (Reactive Ion Etching). Further, a STI trench 22 is formed when the semiconductor substrate w is etched down, for example, 300 nm, and the resist pattern is removed. In this state, the STI trench 22 has a little inclination, that is, a taper having an angle of less than 90° resulting from machinability of RIE.

Figure 3D:
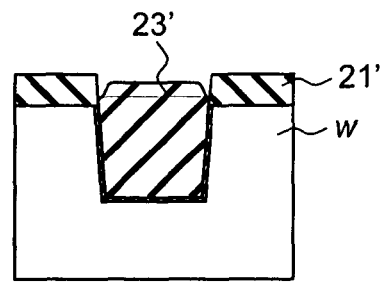
Figure 3B:
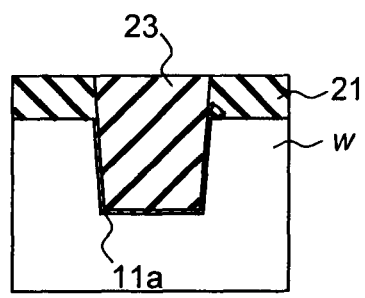

As illustrated in FIG. 3B, the STI trench 22 is embedded when the thermal oxide film 11*a* is formed in the STI trench 22, and a TEOS film 23 is deposited. Using CMP (Chemical Mechanical Polishing) method, flattening is performed with the SiN film 21 as a stopper. The SiN film 21 has a taper having an angle of less than 90° at an interface to the TEOS film 23.

Figure 3E:
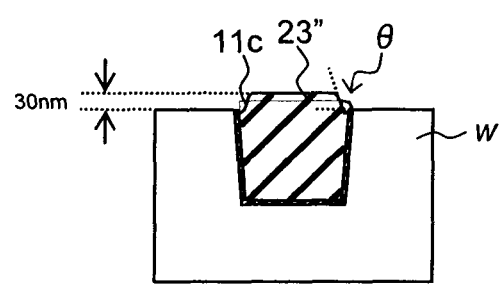
Figure 3C:
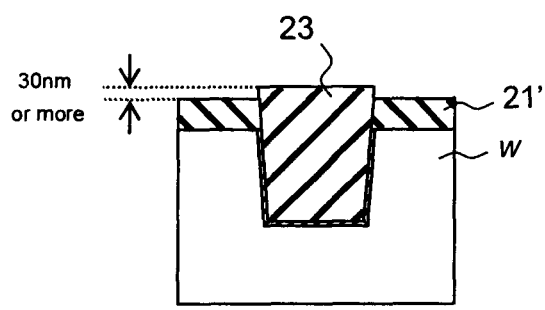

As illustrated in FIG. 3C, a top portion of the SiN film 21 is selectively etched (half-etched) by hot phosphoric acid solution. To control a height of the STI, for example, to 30 nm, an amount of 30 nm or more is removed (a SiN film 21' remains), a part of the side face of the TEOS film 23 is exposed. A half-etching amount can be controlled by controlling an etching period.

As illustrated in FIG. 3D, the TEOS film 23 is isotropically wet etched, for example, by about 30 nm (TEOS film 23'), using buffered hydrofluoric acid (BFH) prepared by blending hydrofluoric acid (HF) with ammonium fluoride ($NH_4F$). A lower portion 21' of the remaining SiN film 21 is selectively etched to be wholly peeled off.

As illustrated in FIG. 3E, the remaining TEOS film 23' is isotropically wet etched, for example, by about 15 nm, using buffered hydrofluoric acid (BFH) solution prepared by blending hydrofluoric acid (HF) with ammonium fluoride ($NH_4F$). By the wet etching, the STI 11 is shaped so that the upper face of the TEOS film 23" is in a state protruding to a height of, for example, 30 nm from a surface of the semiconductor substrate w and a taper angle θ of the side surface of the TEOS film 23" is 90° or more.

Figure 4:
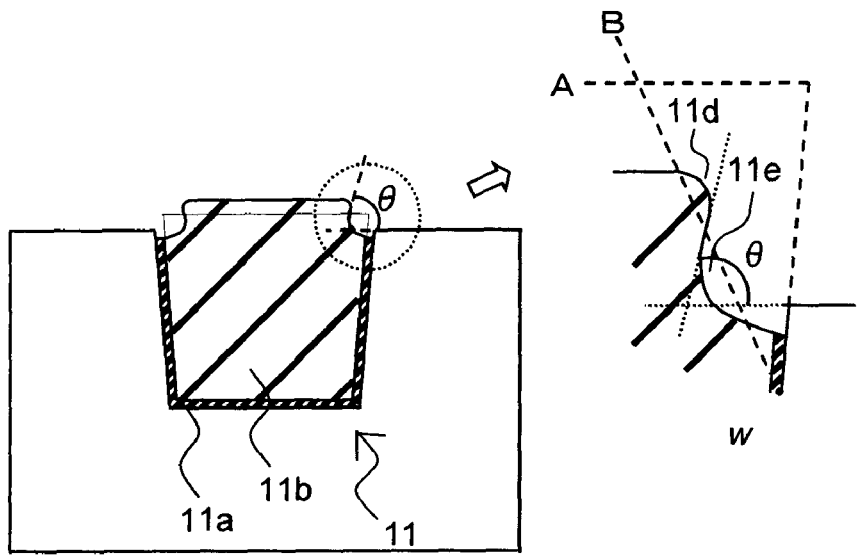
FIG. 4 is a view illustrating a side face shape of STI according to an aspect of the present invention.

In this state, for example, as illustrated in FIG. 4, a shoulder portion 11*d* of the STI is chamfered by shaping and becomes averagely smoother (as shown by a dotted line B) than the case of no shaping (as shown by a dotted line A). However, where there is a portion having a taper angle of less than 90° (a constricted portion 11*e*), the portion becomes shaded during RIE and etching residues generated during processing of a gate electrode and a gate side wall remain. By adjusting a half-etching amount of the SiN film 21 as needed, the taper angle of the TEOS film 23" is controlled to be 90° or more.

Impurities are doped in the semiconductor substrate w to form an impurity diffusion region which is a P-type or N-type well channel region on the surface side of the semiconductor substrate w. After the surface of the semiconductor substrate w is preprocessed, an insulation film for a gate insulation film 13*a* is formed in the thickness of, for example, 1.3 nm. On the insulation film, a polysilicon film for a polysilicon layer 13*b* constituting the gate electrode 13 is formed in the thickness of, for example, 150 nm, using LPCVD method.

A resist film is applied onto a polysilicon film and a resist pattern is formed using the lithographic method. The polysilicon film is etched using the RIE method with the resist pattern as a mask. After etching, the resist pattern is removed to form the polysilicon layer 13*b* constituting a gate electrode 13. The exposed insulation film is wholly removed by wet etching to form the gate electrode 13.

Impurities are doped in the well to form a shallow impurity diffusion region. After the TEOS film is formed in the thickness of, for example, 20 nm using LPCVD method, a SiN film is formed in the thickness of, for example, 20 nm. Using RIE method, the SiN film is etched back until the polysilicon layer 13*b* is exposed. As described above, a gate side wall including the TEOS film 14*a* and the SiN film 14*b* is formed beside the gate electrode 13.

Impurities are doped in the well to form the active area 12 having a source-drain region and a LDD region. After the source-drain region and a surface of the polysilicon layer 13*b* are salicided, the interlayer film 15 is formed. The contact 16 is formed so as to penetrate through the interlayer film 15. In addition, the upper-layer wiring 17 and an electrode (not illustrated) are formed, and a MOSFET cell as illustrated in FIG. 1 is fabricated.

By half etching the SiN film 21 in the MOSFET cell formed in this way, lower yield caused by dust generation resulting from etching residues can be inhibited without generation of etching residues to a STI side surface during processing of a gate electrode or gate side walls. In addition, damage to the semiconductor substrate w can be inhibited during tapering, thus obtaining satisfactory element characteristics.

Further, half etching using hot phosphoric acid used for removing a SiN film at the postprocess can be implemented, and a process can be easily added.

Figure 5:
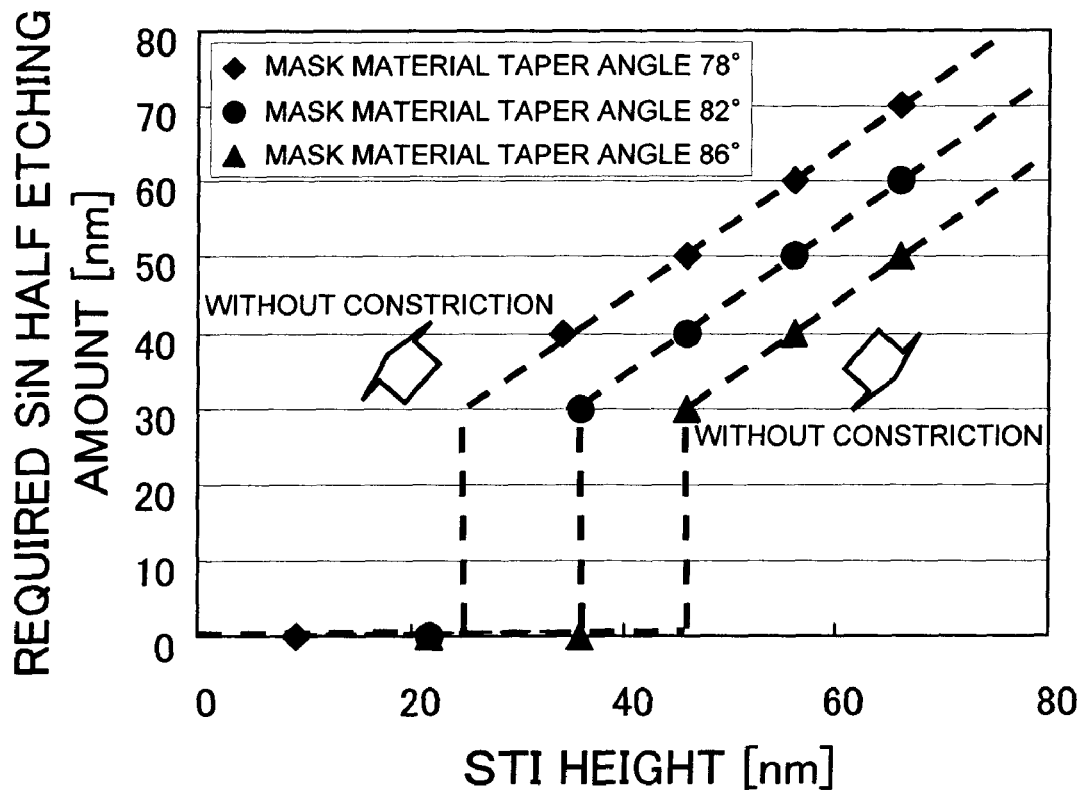
FIG. 5 is a view illustrating a relationship between a STI height and a required half-etching amount according to an aspect of the present invention.

As described above, by only etching the STI side surface, a good side surface shape cannot be obtained and drawbacks such as generation of a constricted portion occur. FIG. 5 illustrates a relationship between a STI height when a taper angle of a SiN film is changed and a half-etching amount required to prevent generation of a constricted portion. As illustrated in FIG. 5, the generation of a constricted portion depends upon a half-etching amount of the SiN film, a height of STI to be formed (a gap relative to a substrate surface), and a taper angle of the SiN film. Specifically, as a taper angle of the SiN film is smaller and the height of STI is higher, a constricted portion tends to occur more often, so that a required half-etching amount increases.

For example, in a case where a taper angle of the SiN film is 78°, when a height of STI is 35 nm, a required half-etching amount is approximately 40 nm. When the height of STI is less than 22 nm, generation of a constricted portion (a portion having a taper angle of less than 90°) can be inhibited without half etching. On the other hand, when the half-etching amount is less than 30 nm, dependence of generation of a constricted portion upon a half-etching amount is inhibited without depending upon a taper angle.

Accordingly, by the previously designed STI height and a taper angle of the SiN film changing with a process, the half-etching amount of the SiN film is adjusted as needed, thus obtaining good STI side surface shape. For example, when a height of STI required for device properties is 22 nm or more, more preferably 30 nm or more and a taper angle of SiN is 74° to 90° which is to be processed in ordinary RIE, it is sufficient to control the half-etching amount to be 30 nm or more.

Since tapering is performed by an isotropical etching manner, the height of STI is equal to or less than the thickness of the SiN film used as a mask. Accordingly, formation of a SiN film is required so as to obtain a film thickness in view of the half-etching amount. On the contrary, when the SiN film thickness is approximately 150 nm which is a mask film thickness in the ordinary process, the height of STI is preferably 50 nm or less to ensure adequate amount of half etching, thus improving shape controllability.

In the present embodiment, the SiN film is half-etched using hot phosphoric acid, which is not specially limited thereto, provided that a selective ratio of the SiN film to an insulation film such as a TEOS film embedded in the STI can be determined. For example, the half etching can employ CDE (Chemical Dry Etching) using $CF_4$, $N_2$, or $C_2$.

In this case, an etching selection ratio of SiN to TEOS ($SiO_2$) is approximately 2:1 and the TEOS film is etched concurrently with the half etching of the SiN film, but it is sufficient to adjust the etching amount of the TEOS film in the wet etching by BHF at the postprocess. In the use of CDE, etching speed and selective ratio change from those in the use of hot phosphoric acid and therefore the shoulder portion of STI is etched a little more and a taper angle of STI shape becomes larger than the present embodiment. When the CDE is used, since an etching process is a dry process, the end point of half etching can be easily controlled.

In the present embodiment, after the remaining lower portion 21' of the SiN film is wholly removed by hot phosphoric acid, the shape is controlled using buffered hydrofluoric acid (BFH) prepared by blending hydrofluoric acid (HF) with ammonium fluoride ($NH_4F$). The shape control of the side surface of STI may be implemented in fluorine pretreatment in forming a gate insulation film at the postprocess.

In the present embodiment, the SiN film is used as a mask material. However, a mask material is not particularly limited. For example, a material such as silicon carbide can be used. In that case, similarly, shape control of the side surface of the STI can be implemented by etching under such a condition where a selective ratio of the mask material to a component material of the STI can be determined.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A manufacturing method for a semiconductor device comprising:
   forming a trench on a semiconductor substrate with a first insulation film patterned on the semiconductor substrate as a mask;
   embedding a second insulation film in the trench;
   selectively removing an upper portion of the first insulation film to expose a part of a side face of the second insulation film;
   isotropically removing a part of the second insulation film;
   selectively removing a lower portion of the remaining first insulation film;
   further isotropically removing a part of the remaining second insulation film to provide an upper face of the second insulation film is at a predetermined height from a surface of the semiconductor substrate, and provide a taper having a minimum taper angle of 90° or more is formed on the side face of the second insulation film, to form a STI.

2. The manufacturing method according to claim 1, wherein the upper portion of the first insulation film is selectively removed by 30 nm or more.

3. The manufacturing method according to claim 2, wherein a taper angle of the patterned first insulation film is 74° to 90°.

4. The manufacturing method according to claim 1, wherein the predetermined height is 22 nm or more.

5. The manufacturing method according to claim 4, wherein the predetermined height is 30 nm or more.

6. The manufacturing method according to claim 4, wherein the predetermined height is 50 nm or less.

7. The manufacturing method according to claim 1, wherein the upper portion of the first insulation film is selectively removed by wet etching using hot phosphoric acid.

8. The manufacturing method according to claim 1, wherein the upper portion of the first insulation film is selectively removed by chemical dry etching using $CF_4$, $N_2$ or $O_2$.

9. The manufacturing method according to claim 1, wherein the lower portion of the first insulation film is selectively removed by wet etching using hot phosphoric acid.

10. The manufacturing method according to claim 1, wherein the lower portion of the first insulation film is selectively removed by chemical dry etching using $CF_4$, $N_2$ or $O_2$.

11. The manufacturing method according to claim 1, wherein the first insulation film is a SiN film.

12. The manufacturing method according to claim 1, wherein a part of the second insulation film is isotropically removed using buffered hydrofluoric acid solution.

13. The manufacturing method according to claim 1, wherein a part of the remaining second insulation film is further isotropically removed using buffered hydrofluoric acid solution.

14. The manufacturing method according to claim 1, wherein the second insulation film includes a TEOS film.

15. The manufacturing method according to claim 1, wherein a gate electrode and a side wall of the gate electrode are formed in a region isolated by the STI.

* * * * *

UNITED STATES PATENT AND TRADEMARK OFFICE
CERTIFICATE OF CORRECTION

PATENT NO.        : 7,875,527 B2  
APPLICATION NO.   : 12/359635  
DATED             : January 25, 2011  
INVENTOR(S)       : Ito et al.

Page 1 of 1

It is certified that error appears in the above-identified patent and that said Letters Patent is hereby corrected as shown below:

Claim 1, column 6, line 6, change "film is" to --film that is--.

Claim 1, column 6, line 8, change "more is" to --more that is--.

Signed and Sealed this
Fourteenth Day of June, 2011

David J. Kappos
*Director of the United States Patent and Trademark Office*